United States Patent
Ishida (10) Patent No.: US 11,003,018 B2
(45) Date of Patent: May 11, 2021

(54) BACKLIGHT UNIT, DISPLAY DEVICE, MANUFACTURING METHOD FOR BACKLIGHT UNIT, MANUFACTURING APPARATUS OF BACKLIGHT UNIT

(71) Applicant: SHARP KABUSHIKI KAISHA, Sakai (JP)

(72) Inventor: Takeshi Ishida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/612,933

(22) PCT Filed: May 10, 2018

(86) PCT No.: PCT/JP2018/018036
§ 371 (c)(1),
(2) Date: Nov. 12, 2019

(87) PCT Pub. No.: WO2018/212050
PCT Pub. Date: Nov. 22, 2018

(65) Prior Publication Data
US 2020/0209682 A1    Jul. 2, 2020

(30) Foreign Application Priority Data
May 17, 2017 (JP) .............................. JP2017-098555

(51) Int. Cl.
G02F 1/13357 (2006.01)
H01L 33/50 (2010.01)
G02F 1/1335 (2006.01)

(52) U.S. Cl.
CPC ........ *G02F 1/133602* (2013.01); *H01L 33/50* (2013.01); *G02F 1/133613* (2021.01); *G02F 1/133614* (2021.01)

(58) Field of Classification Search
CPC ........................... G02F 1/133602; H01L 33/50
USPC ....................................................... 362/97.1
See application file for complete search history.

(56) References Cited

U.S. PATENT DOCUMENTS

| | | | | |
|---|---|---|---|---|
| 9,142,738 | B2* | 9/2015 | Tischler | H01L 33/508 |
| 9,291,315 | B2* | 3/2016 | Sorg | F21S 41/176 |
| 9,677,719 | B2* | 6/2017 | He | F21K 9/64 |
| 9,803,831 | B2* | 10/2017 | Wang | F21V 9/30 |
| 10,168,006 | B2* | 1/2019 | Chang | F21K 9/60 |

(Continued)

FOREIGN PATENT DOCUMENTS

| | | |
|---|---|---|
| JP | 2009-158462 A | 7/2009 |
| JP | 2016-164853 A | 9/2016 |

(Continued)

*Primary Examiner* — Bryon T Gyllstrom
(74) *Attorney, Agent, or Firm* — ScienBiziP, P.C.

(57) ABSTRACT

Provided is a backlight unit (2) including a light source (4) where multiple light-emitting elements (8) are two-dimensionally laid out, and a wavelength converting member (6) that has a phosphor (12), and that converts a wavelength of light from the light source, where a wavelength conversion capability varies in accordance with a distance to a light-emitting element that is closest of the multiple light-emitting elements, in order to reduce color unevenness that occurs depending on difference in distance between the light source and wavelength converting member of the backlight unit.

15 Claims, 7 Drawing Sheets

(56) References Cited

U.S. PATENT DOCUMENTS

| | | | | |
|---|---|---|---|---|
| 2008/0019147 A1* | 1/2008 | Erchak | ................... | H05B 45/40 |
| | | | | 362/607 |
| 2009/0003002 A1* | 1/2009 | Sato | ..................... | G02B 6/0043 |
| | | | | 362/341 |
| 2010/0315320 A1* | 12/2010 | Yoshida | ............ | G02F 1/133603 |
| | | | | 345/83 |
| 2011/0018012 A1* | 1/2011 | Tanaka | ...................... | F21V 3/00 |
| | | | | 257/89 |
| 2011/0164203 A1* | 7/2011 | Kimura | ............. | G02F 1/133603 |
| | | | | 349/62 |
| 2012/0033404 A1* | 2/2012 | Wu | ........................... | F21K 9/64 |
| | | | | 362/84 |
| 2016/0077381 A1* | 3/2016 | Ma | ................... | G02F 1/133605 |
| | | | | 362/97.1 |
| 2017/0365225 A1* | 12/2017 | Yoneyama | ........ | G02F 1/133603 |

FOREIGN PATENT DOCUMENTS

| | | |
|---|---|---|
| WO | 2010/150516 A1 | 12/2010 |
| WO | 2016/186158 A1 | 11/2016 |

* cited by examiner

BACKLIGHT UNIT, DISPLAY DEVICE, MANUFACTURING METHOD FOR BACKLIGHT UNIT, MANUFACTURING APPARATUS OF BACKLIGHT UNIT

TECHNICAL FIELD

The present invention relates to a backlight unit, and particularly relates to a backlight unit provided with a wavelength converting member that has a phosphor.

BACKGROUND ART

PTL 1 discloses means to reduce coloring which occurs at portions that should be displayed dark in an image display apparatus having a backlight unit that is provided with a wavelength converting member and that is capable of local dimming control.

CITATION LIST

Patent Literature

PTL 1: Japanese Unexamined Patent Application Publication "Japanese Unexamined Patent Application Publication No. 2016-164853 (published Sep. 8, 2016)"

SUMMARY OF INVENTION

Technical Problem

The inventor has found that color unevenness occurs depending on difference in distance between a light source of the backlight unit and the wavelength converting member. The above problem is pronounced in a case where light is emitted toward the wavelength converting member only from limited positions by local dimming control, or a case where the backlight unit has light sources situated locally or the like.

Solution to Problem

In order to solve the above problem, a backlight unit according to an aspect of the present invention includes a light source where multiple light-emitting elements are two-dimensionally laid out, and a wavelength converting member that has a phosphor and that converts a wavelength of light from the light source. A wavelength conversion capability of the wavelength converting member varies in accordance with a distance to a light-emitting element that is closest of the multiple light-emitting elements.

Advantageous Effects of Invention

According to an aspect of the present invention, an advantage can be obtained in that color unevenness occurring depending on difference in distance between the light source and wavelength converting member of the backlight unit is reduced.

DESCRIPTION OF EMBODIMENTS

Embodiment 1

Figure 1:
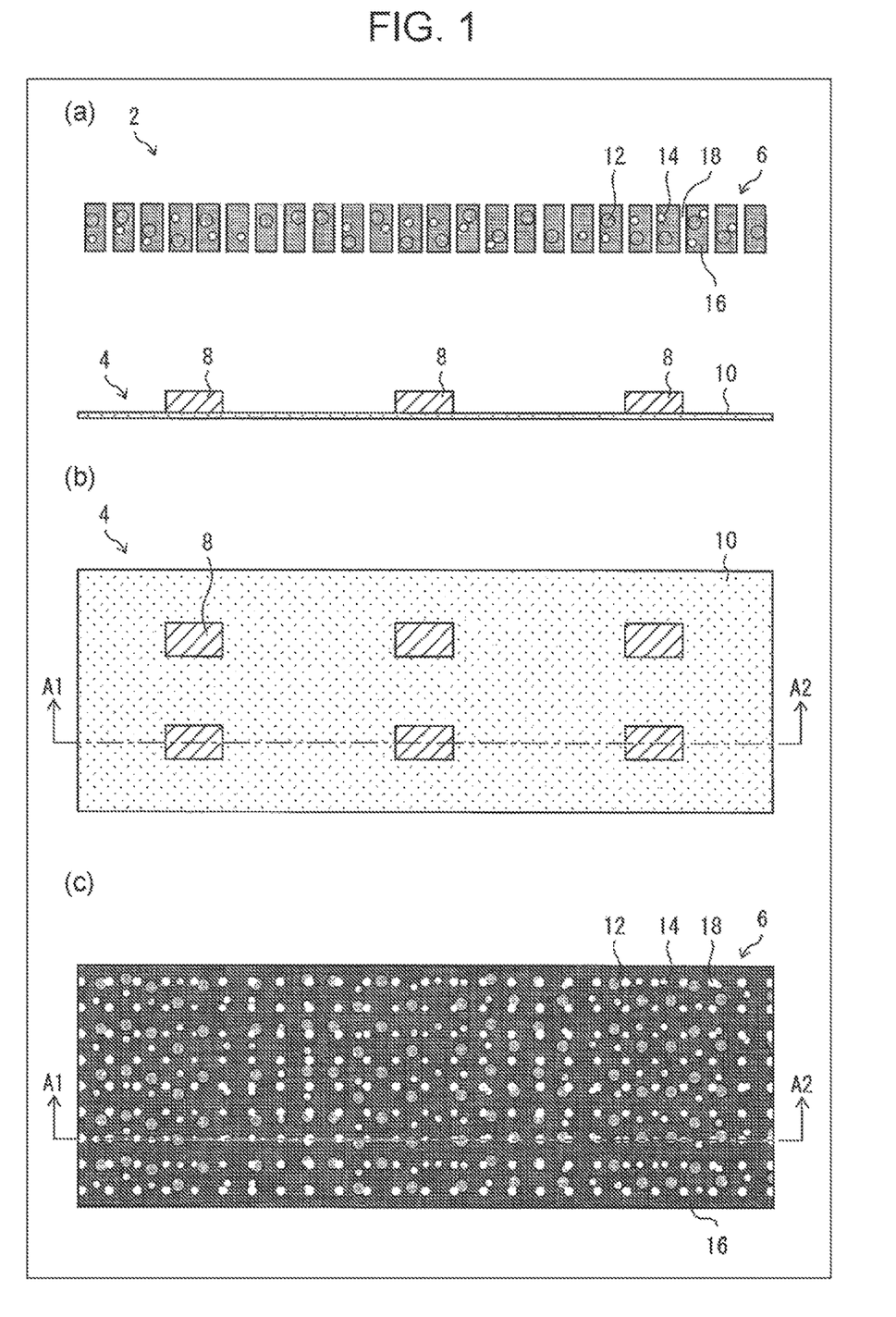
FIG. 1 is a sectional view and top views illustrating a backlight unit according to Embodiment 1 of the present invention.

FIG. 1 is schematic diagrams illustrating a backlight unit according to the present embodiment. (a) in FIG. 1 is a sectional view of a backlight unit, (b) in FIG. 1 is a top view of a light source, and (c) in FIG. 1 is a top view of a wavelength converting member. The sectional view illustrated in (a) in FIG. 1 is a sectional diagram taken along line A1-A2, as viewed in the direction of arrows in (b) and (c) in FIG. 1. Note that in the following description, the direction from the light source toward the wavelength converting member will be described as being the upward direction.

A backlight unit 2 according to the present embodiment has a light source 4 and a wavelength converting member 6. The light source 4 and wavelength converting member 6 are placed facing each other so that light from the light source 4 is incident on the wavelength converting member 6.

The light source 4 includes multiple blue-light-emitting elements 8 serving as light-emitting elements, and a light-emitting element board 10. The blue-light-emitting elements 8 are two-dimensionally laid out on the light-emitting element board 10. The blue-light-emitting elements 8 emit blue light, with the light emission intensity being individually controlled. The light-emitting element board 10 may also have a function of a reflecting plate that reflects light from the blue-light-emitting elements 8 toward the direction of the wavelength converting member 6.

The wavelength converting member 6 includes red phosphors 12, green phosphors 14, and resin 16. The red phosphors 12 and green phosphors 14 are phosphors dispersed in the resin 16. A phosphor is a substance that has a nature of absorbing incident light, and emitting fluorescence of a longer wavelength than the light that has been absorbed. The phosphors may be quantum dot phosphors, or may be compounds such as sulfide phosphors obtained by doping the host with light-emitting ions as an activator, for example. When blue light from the light source 4 is incident, the red phosphors 12 and green phosphors 14 perform wavelength conversion of the incident blue light into red light and green light respectively, and emit the converted light as fluorescence in the present embodiment.

The wavelength converting member 6 may include a scattering agent that is omitted from illustration, to scatter the fluorescence from the respective phosphors and the blue light from the blue-light-emitting elements 8. The wavelength converting member 6 may also have a textured structure on the upper face, and scatter light emitted upward from the upper face.

The wavelength converting member 6 has multiple holes 18 that are two-dimensionally arranged at equal intervals in the present embodiment. The holes 18 are formed from the upper face of the wavelength converting member 6 to the lower face, perpendicularly to the respective faces. The aforementioned phosphors do not exist in the holes 18, and accordingly, the blue light transmitted through the holes 18 is not subjected to wavelength conversion. The sizes of the holes 18 vary depending on the position on the wavelength converting member 6. In the present embodiment, a design is implemented where the longer the distance between the blue-light-emitting element 8 that is closest and the wavelength converting member 6 is, the greater the size of the hole 18 is.

Figure 2:
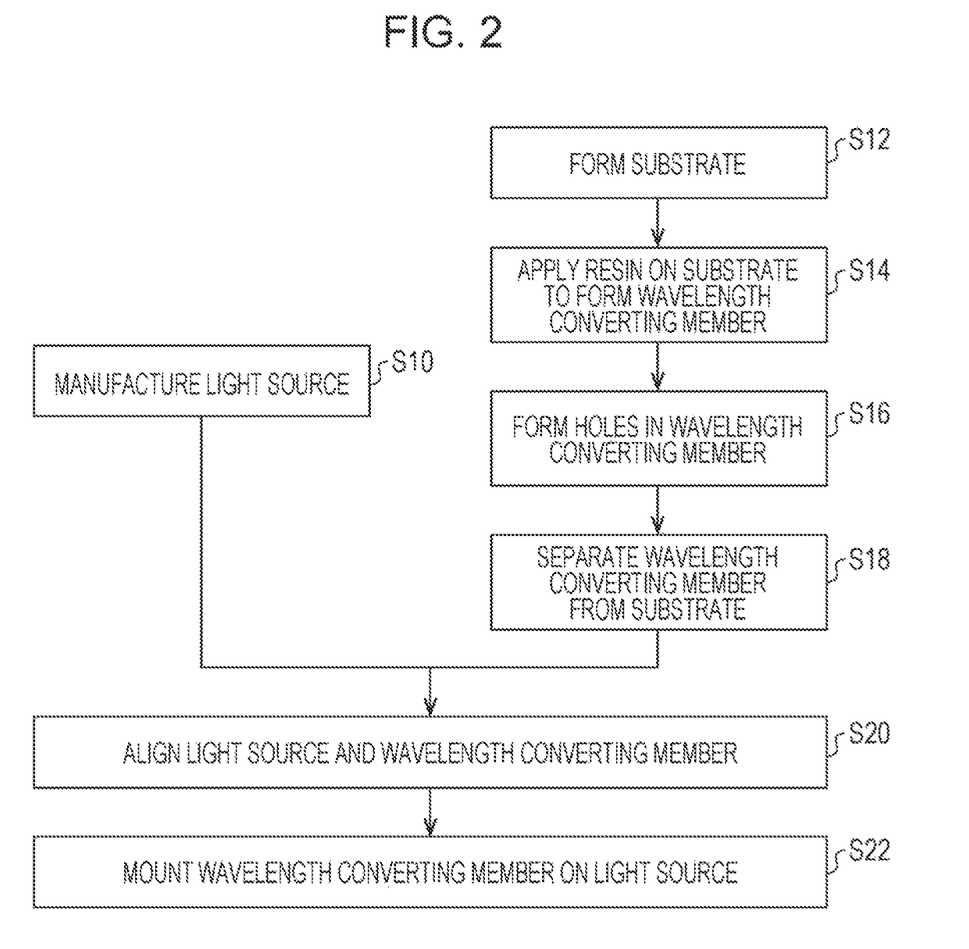
FIG. 2 is a flowchart for describing manufacturing processes of the backlight unit according to Embodiment 1 of the present invention.
Figure 3:
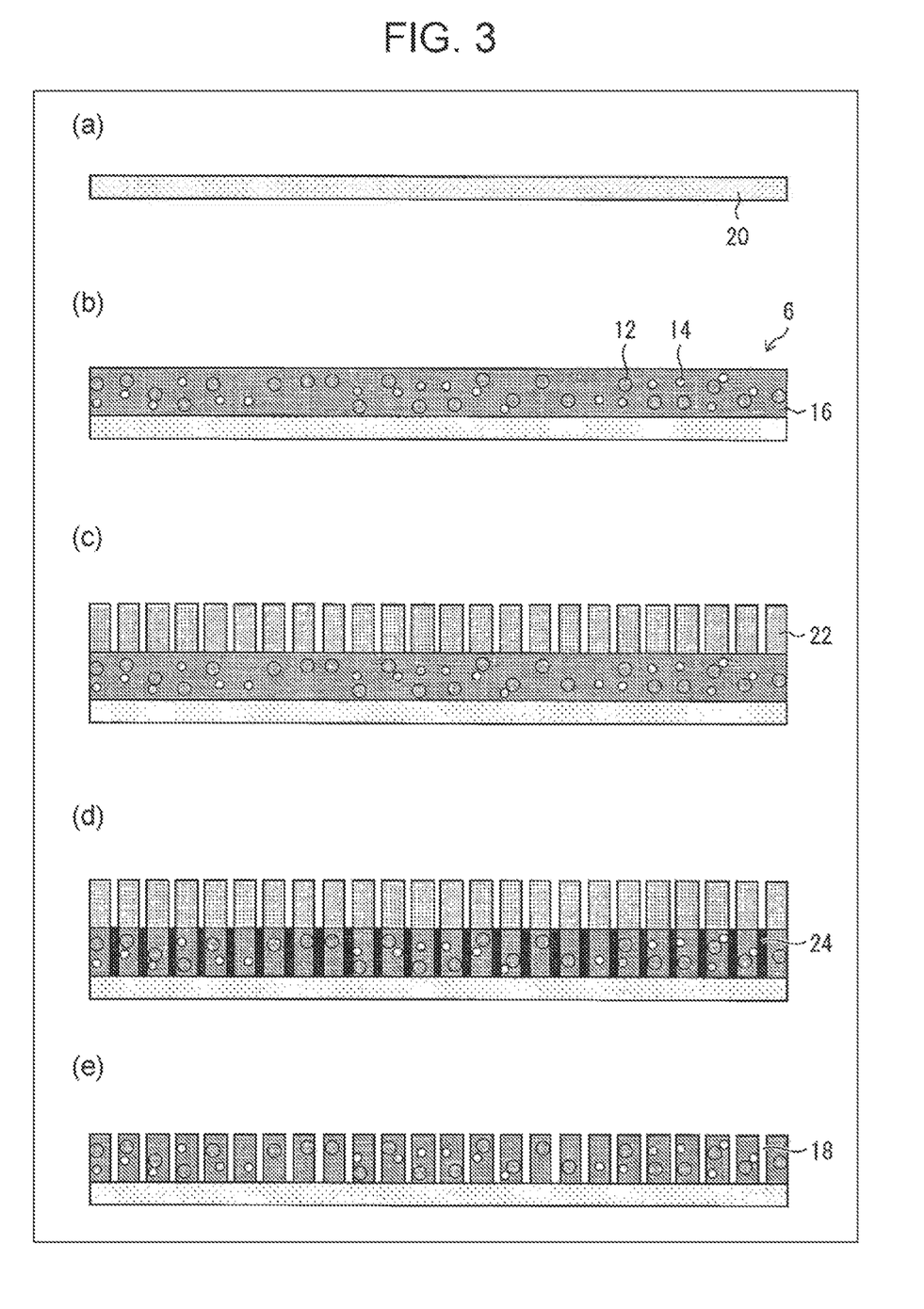
FIG. 3 is process sectional views for describing manufacturing processes of a wavelength converting member according to Embodiment 1 of the present invention.

Next, a manufacturing method of the backlight unit 2 according to the present embodiment will be described with reference to FIG. 2 and FIG. 3. FIG. 2 is a flowchart for describing an example of the manufacturing method of the backlight unit 2 according to the present embodiment. FIG. 3 is process sectional views for describing an example of a manufacturing method of the wavelength converting member 6 according to the present embodiment, in the order of (a) through (e).

First, manufacturing of the light source 4 and wavelength converting member 6 is performed. Manufacturing of the light source 4 (S10) may be performed by two-dimensionally laying out the multiple blue-light-emitting elements 8 on the light-emitting element board 10.

Next, manufacturing of the wavelength converting member 6 (S12 through S18) will be described in detail with reference to FIG. 3. An example of manufacturing the wavelength converting member 6 from resin 16 including positive-type photosensitive resin, using a photolithography process, will be described in the present embodiment. However, this is not restrictive, and the wavelength converting member 6 may be manufactured from resin 16 containing negative-type photosensitive resin, using the photolithography process.

First, a substrate 20 is formed (S12), as illustrated in (a) in FIG. 3. The substrate 20 may be a barrier layer that does not transmit substances (e.g., moisture) that could deactivate the phosphors of the wavelength converting member 6. Next, the resin 16 in which is dispersed the red phosphors 12 and green phosphors 14 is applied onto the substrate 20 and cured, thereby forming the wavelength converting member 6 as illustrated in (b) in FIG. 3 (S14).

Subsequently, holes 18 are formed in the wavelength converting member 6 (S16). A photomask 22 that blocks light is first placed on the upper face of the wavelength converting member 6, as illustrated in (c) in FIG. 3. The photomask 22 is provided with openings each having a size according to the size of the corresponding hole 18 to be formed in the wavelength converting member 6. By radiating light from above the wavelength converting member 6 in this state, only light that has been transmitted through the openings in the photomask 22 is radiated onto the wavelength converting member 6.

Accordingly, exposed resin 24 is formed only at portions of the wavelength converting member 6 directly below the openings in the photomask 22, as illustrated in (d) in FIG. 3. Finally, the photomask 22 is separated from the wavelength converting member 6, and the exposed resin 24 is removed by a developing liquid, whereby the wavelength converting member 6 in which the holes 18 are formed, illustrated in (e) in FIG. 3, is obtained. The wavelength converting member 6 is obtained as a single unit by subsequently separating the wavelength converting member 6 from the substrate 20 (S18). Note that in a case of manufacturing the wavelength converting member 6 from resin 16 including negative-type photosensitive resin using the photolithography process, exposure and developing can be performed in a state in which the photomask 22 is placed matching the positions on the wavelength converting member 6 where the holes 18 are to be formed.

Next, the light source 4 and wavelength converting member 6 are aligned (S20). Specifically, positioning is performed so that holes 18 that have the smallest diameter from among the holes 18 of the wavelength converting member 6 are situated immediately above respective blue-light-emitting elements 8 of the light source 4. The wavelength converting member 6 is mounted to the light source 4 in this state (S22), thereby yielding the backlight unit 2 illustrated in FIG. 1.

A manufacturing method where holes 18 are formed in the wavelength converting member 6 using photolithography has been described in the above manufacturing method. However, this is not restrictive, and the holes 18 may be formed by subjecting the wavelength converting member 6 to processing such as etching or the like, or the holes 18 may be formed by selectively applying the resin 16 by printing or inkjet.

Figure 4:
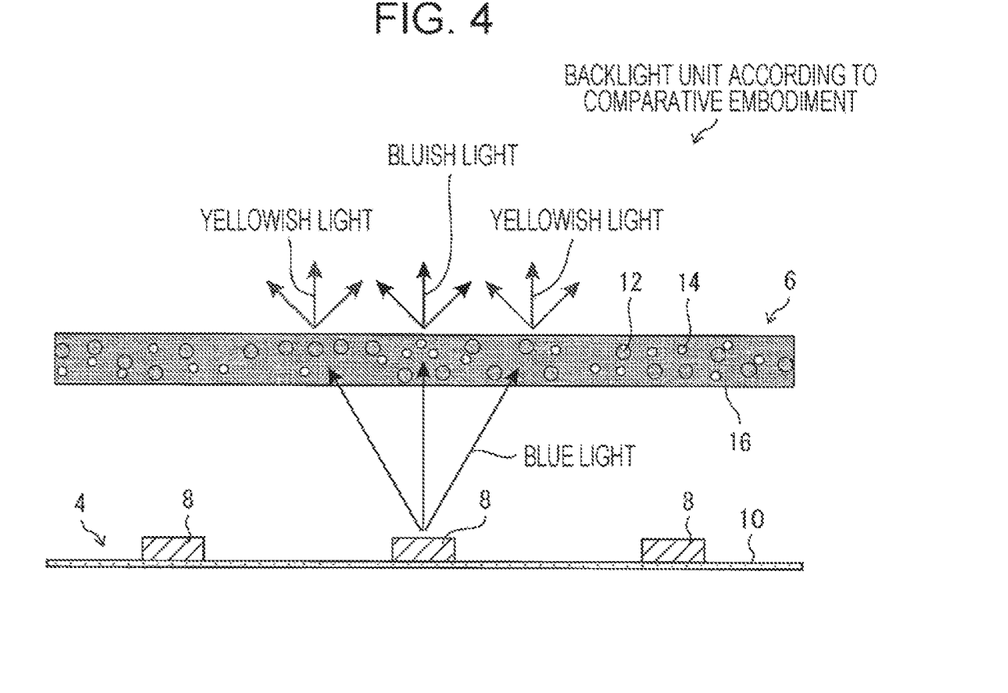
FIG. 4 is a diagram illustrating a state of operation at the time of use of a backlight unit according to a comparative embodiment.
Figure 5:
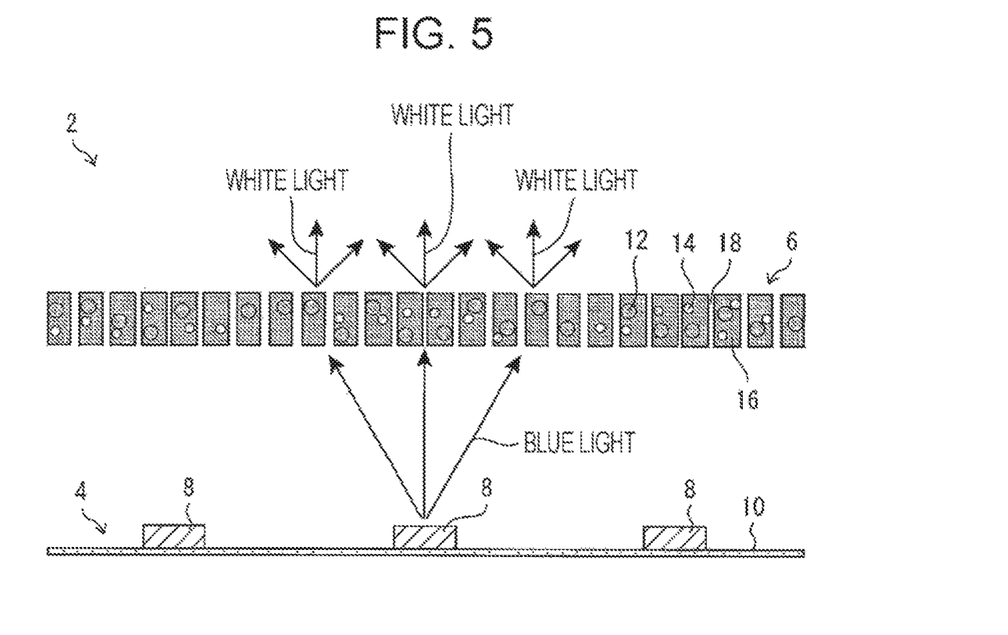
FIG. 5 is a diagram illustrating a state of operation at the time of use of the backlight unit according to Embodiment 1 of the present invention.

Advantages yielded by the backlight unit 2 according to the present embodiment will be described by comparison between FIG. 4 and FIG. 5. FIG. 4 and FIG. 5 are sectional views of a backlight unit according to a comparative embodiment and the backlight unit 2 according to the present embodiment, with regard to a state of operation at the time of use. A case where only one of the blue-light-emitting elements 8 has been made to emit light is illustrated in FIG. 4 and FIG. 5.

When blue light from the blue-light-emitting element 8 of the backlight unit according to the comparative embodiment is incident on the wavelength converting member 6, the red phosphors 12 and green phosphors 14 absorb part of the blue light, and each emit fluorescence, as illustrated in FIG. 4. Blue light not absorbed by the above phosphors is transmitted through the wavelength converting member 6 without change. Accordingly, the red light and green light of the fluorescence and the blue light that has been transmitted are averaged, whereby generally white light is emitted from the upper face of the wavelength converting member 6.

Now, the incident angle of blue light from the blue-light-emitting element 8 differs depending on the position on the wavelength converting member 6, as illustrated in FIG. 4. Particularly, at positions away from the blue-light-emitting element 8, the incident angle of blue light from the blue-light-emitting element 8 deviates from the perpendicular direction to the upper and lower faces of the wavelength converting member 6 toward the horizontal direction, as compared with blue light incident on a position on the wavelength converting member 6 immediately above the blue-light-emitting element 8.

Accordingly, blue light transmitted at positions away from the blue-light-emitting element 8 is transmitted through the wavelength converting member 6 for a longer distance, thereby raising the proportion of blue light subjected to wavelength conversion as compared with blue light transmitted through the wavelength converting member 6 at the position immediately above the blue-light-emitting element 8.

Accordingly, color unevenness in light emitted from the upper face of the wavelength converting member 6 occurs between the position immediately above the blue-light-emitting element 8 and positions away from the blue-light-emitting elements 8. Particularly, bluish light is emitted from the upper face of the wavelength converting member 6 at the position immediately above the blue-light-emitting element 8 since the proportion of blue light subjected to wavelength conversion is lower. Conversely, yellowish light is emitted from the upper face of the wavelength converting member 6 at positions away from the blue-light-emitting element 8 since the proportion of blue light subjected to wavelength conversion is greater.

Multiple holes 18 are formed in the wavelength converting member 6, having different sizes depending on the position on the wavelength converting member 6 in the backlight unit 2 according to the present embodiment, as illustrated in FIG. 5. Accordingly, blue light from the blue-light-emitting element 8 is not subjected to wavelength conversion when being transmitted through the holes 18. Also, the holes 18 are formed so that the longer the distance from a hole 18 to the blue-light-emitting element 8 that is closest is, the larger the diameter of the hole 18 is.

Accordingly, the longer the distance from the blue-light-emitting element 8 is, the lower the proportion of wavelength conversion of blue light incident on the wavelength converting member 6 is. That is to say, the longer the distance to the blue-light-emitting element 8 that is closest is, the lower the wavelength conversion capability of the wavelength converting member 6 is. Note that wavelength conversion capability represents the proportion of blue light subjected to wavelength conversion as to blue light transmitted through the wavelength converting member 6 perpendicularly to the upper and lower faces of the wavelength converting member 6.

Accordingly, the proportion of wavelength conversion of blue light incident on positions on the wavelength converting member 6 away from the blue-light-emitting elements 8 is low as compared with an arrangement where the holes 18 are not provided. Consequently, the proportion of blue light that is transmitted unchanged without being subjected to wavelength conversion is higher, and color unevenness is reduced in light emitted from the upper face of the wavelength converting member 6 at positions away from the blue-light-emitting elements 8.

Figure 6:
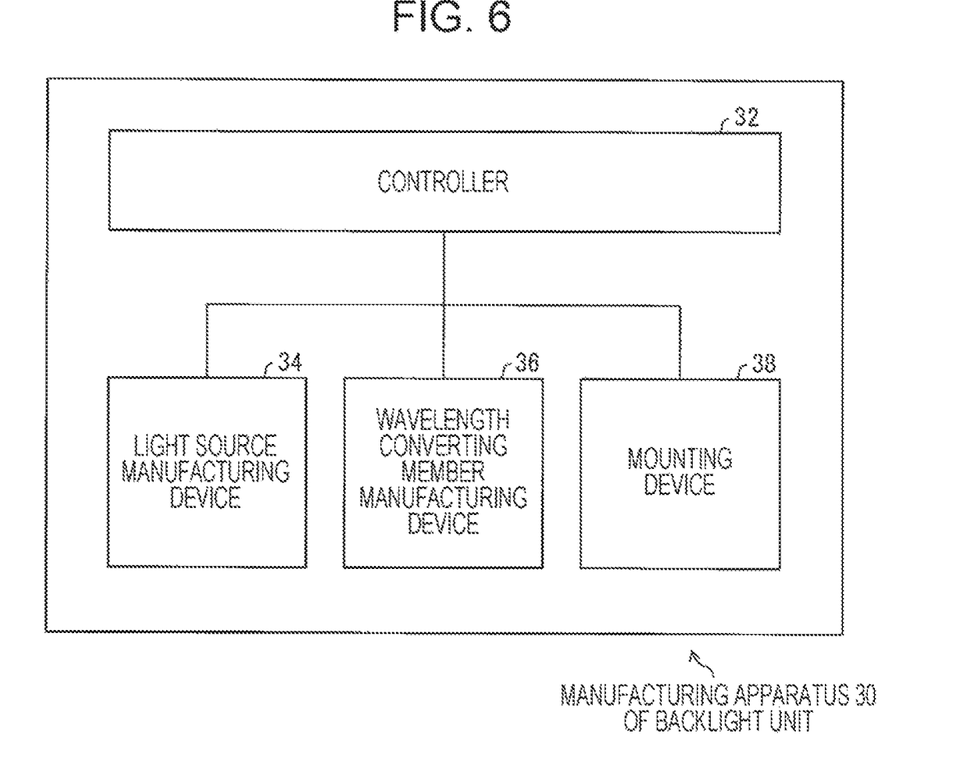
FIG. 6 is a block diagram illustrating a manufacturing apparatus of the backlight unit according to Embodiment 1 of the present invention.

FIG. 6 is a block diagram illustrating a manufacturing apparatus that manufactures the backlight unit 2 according to the present embodiment. A manufacturing apparatus 30 of the backlight unit includes a controller 32, a light source manufacturing device 34, a wavelength converting member manufacturing device 36, and a mounting device 38. The light source manufacturing device 34 may place the blue-light-emitting elements 8 on the light-emitting element board 10. The wavelength converting member manufacturing device 36 may perform formation of the substrate 20 and wavelength converting member 6, formation of the holes 18 in the wavelength converting member 6, and separating of the wavelength converting member 6 from the substrate 20. The mounting device 38 may perform alignment of the light source 4 and wavelength converting member 6, and mounting of the wavelength converting member 6 onto the light source 4. The controller 32 may control the light source manufacturing device 34, the wavelength converting member manufacturing device 36, and the mounting device 38.

Embodiment 2

Figure 7:
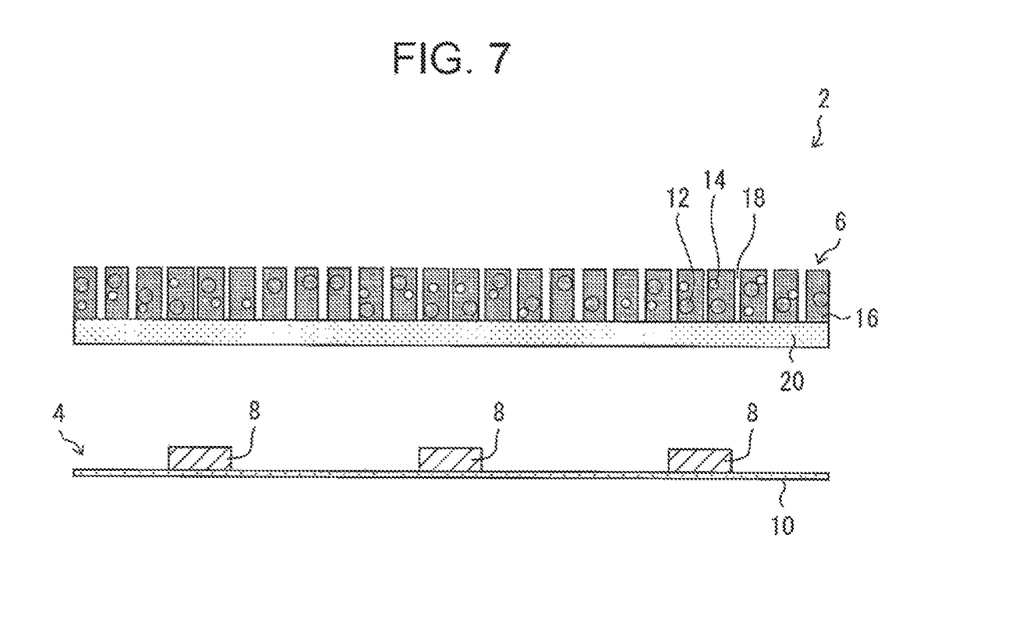
FIG. 7 is a sectional view illustrating a backlight unit according to Embodiment 2 of the present invention.

FIG. 7 is a sectional view illustrating the backlight unit 2 according to the present embodiment. The backlight unit 2 according to the present embodiment differs in comparison with the previous embodiment only with regard to the point that the substrate 20 is provided on the lower face of the wavelength converting member 6. The substrate 20 according to the present embodiment is transparent, and may be the same as the substrate 20 in the previous embodiment.

The backlight unit 2 may be obtained by mounting the wavelength converting member 6 as it is on the light source 4 without separating the wavelength converting member 6 from the substrate 20 in the manufacturing method described in the previous embodiment. In this case, the process of separating the wavelength converting member 6 from the substrate 20 can be omitted. On the other hand, the backlight unit 2 may be obtained by forming the wavelength converting member 6, in which holes 18 have been formed, on the substrate 20 formed above the light source 4. In this case, the process of aligning and mounting the light source 4 and wavelength converting member 6 can be omitted, by performing alignment at the time of forming the holes 18.

Embodiment 3

Figure 8:
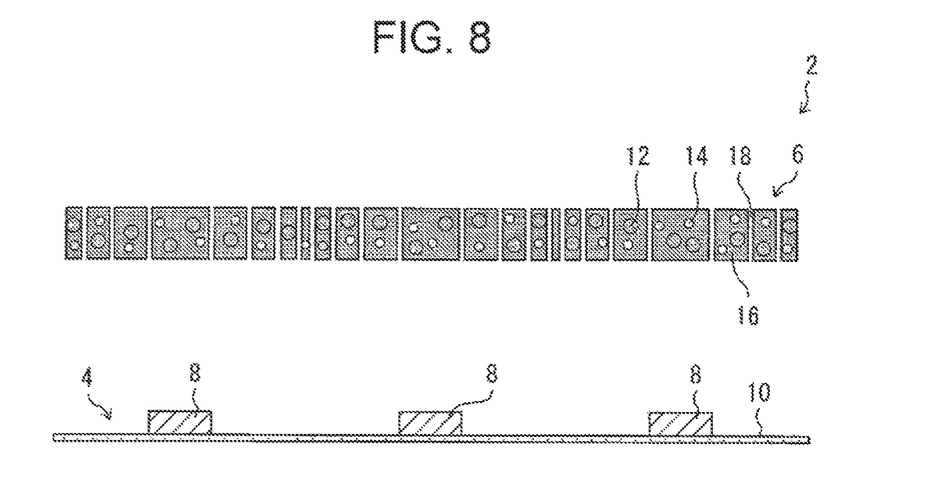
FIG. 8 is a sectional view illustrating a backlight unit according to Embodiment 3 of the present invention.

FIG. 8 is a sectional view illustrating the backlight unit 2 according to the present embodiment. The backlight unit 2 according to the present embodiment differs in comparison with the above-described embodiment only with regard to the point that the shapes and intervals of the holes 18 provided in the wavelength converting member 6 are different.

The shapes of the multiple holes 18 may all be equal in the present embodiment, as illustrated in FIG. 8. The holes 18 are also formed with higher density in the wavelength converting member 6 the longer the distance from the blue-light-emitting elements 8 is. That is to say, the holes 18 are designed so that the longer the distance from the blue-light-emitting elements 8 is, the shorter the intervals among adjacent holes 18 are. Accordingly, the longer the distance is from a blue-light-emitting element 8 at a position, the longer the distance of blue light from the blue-light-emitting element 8 transmitted through the holes 18 is, and accordingly the lower the wavelength conversion capability of the wavelength converting member 6 is. Thus, color unevenness dependent on the position on the wavelength converting member 6 is reduced.

The above holes 18 may be obtained by changing the density of openings provided in the photomask 22, in the manufacturing method of the wavelength converting member 6 described above.

Embodiment 4

Figure 9:
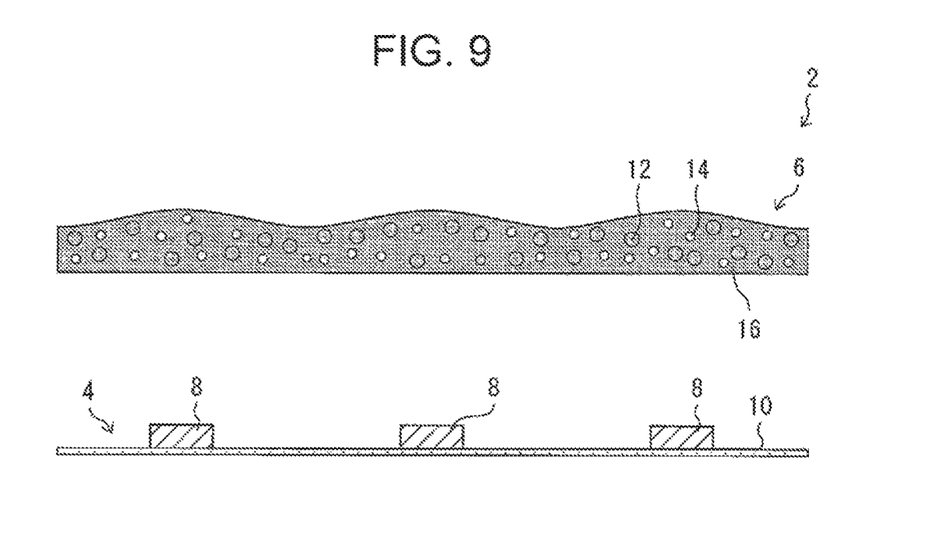
FIG. 9 is a sectional view illustrating a backlight unit according to Embodiment 4 of the present invention.

FIG. 9 is a sectional view illustrating the backlight unit 2 according to the present embodiment. The backlight unit 2 according to the present embodiment differs in comparison with the above-described embodiments with regard to the point that the film thickness of the wavelength converting member 6 varies depending on the position on the wavelength converting member 6 and there are no holes 18.

The film thickness of the wavelength converting member 6 differs depending on the position on the wavelength converting member 6 in the present embodiment, as illustrated in FIG. 9. Specifically, the longer the distance from the blue-light-emitting element 8 that is closest is, the thinner the film thickness of the wavelength converting member 6 gradually becomes. Accordingly, the longer the distance is from a blue-light-emitting element 8 at a position, the shorter the distance of blue light from the blue-light-emitting element 8 transmitted through the wavelength converting member 6 is, and accordingly the lower the wavelength conversion capability of the wavelength converting member 6 is. Thus, color unevenness dependent on the position on the wavelength converting member 6 is reduced.

The wavelength converting member 6 may be manufactured by photolithography using a halftone photomask in the above-described manufacturing method. Alternatively, the wavelength converting member 6 may be obtained by changing the film thickness during application of the resin 16 on the substrate 20 by printing or inkjet.

Embodiment 5

Figure 10:
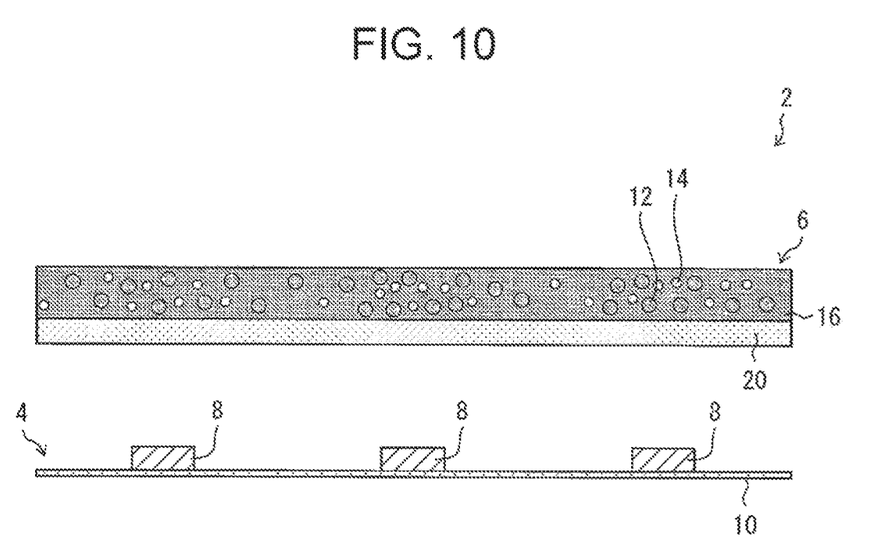
FIG. 10 is a sectional view illustrating a backlight unit according to Embodiment 5 of the present invention.

FIG. 10 is a sectional view illustrating the backlight unit 2 according to the present embodiment. The backlight unit 2 according to the present embodiment differs in comparison with the above-described embodiments only with regard to the point that the dispersion density of phosphors in the wavelength converting member 6 varies depending on the position on the wavelength converting member 6 and there are no holes 18.

The density of red phosphors 12 and green phosphors 14 contained in the wavelength converting member 6 differs depending on the position on the wavelength converting member 6 in the present embodiment, as illustrated in FIG. 10. Specifically, the longer the distance from the blue-light-emitting element 8 that is closest is, the lower the density of phosphors dispersed in the resin 16 of the wavelength converting member 6 gradually becomes. Accordingly, the longer the distance is from a blue-light-emitting element 8 at a position, the smaller the count of phosphors on the optical path of blue light from the blue-light-emitting element 8 transmitted through the wavelength converting member 6 is, and accordingly the lower the wavelength conversion capability of the wavelength converting member 6 is. Thus, color unevenness dependent on the position on the wavelength converting member 6 is reduced.

The wavelength converting member 6 may be obtained by changing the count of phosphors contained therein during application of the resin 16 on the substrate 20 by printing or inkjet.

The backlight unit 2 according to each of the embodiments described above can be employed as a backlight for a display device such as a liquid crystal display device or the like, for example. In particular, the backlight unit 2 according to the embodiments of the present invention has pronounced effects in reducing color unevenness of display images in a display device that uses local dimming control, where luminance of the backlight is locally controlled in accordance with the image being displayed.

[Summarization]

A backlight unit according to Aspect 1 includes a light source where multiple light-emitting elements are two-dimensionally laid out, and a wavelength converting member that has a phosphor, and that converts a wavelength of light from the light source. A wavelength conversion capability of the wavelength converting member varies in accordance with a distance to a light-emitting element that is closest of the multiple light-emitting elements.

According to Aspect 2, the light-emitting element emits blue light.

According to Aspect 3, the wavelength converting member is provided with a red phosphor that emits red light, and a green phosphor that emits green light.

According to Aspect 4, the wavelength converting member has multiple holes.

According to Aspect 5, a size of the holes varies in accordance with the distance.

According to Aspect 6, the size of the holes increases as the distance becomes longer.

According to Aspect 7, an interval at which the holes are provided varies in accordance with the distance.

According to Aspect 8, the interval at which the holes are provided becomes shorter as the distance becomes longer.

According to Aspect 9, a film thickness of the wavelength converting member varies in accordance with the distance.

According to Aspect 10, the film thickness becomes thinner as the distance becomes longer.

According to Aspect 11, a density of phosphors varies in accordance with the distance, each of the phosphors being the phosphor that the wavelength converting member has.

According to Aspect 12, the density of the phosphors becomes lower as the distance becomes longer.

According to Aspect 13, the wavelength converting member further includes a substrate.

According to Aspect 14, light emission intensity of the multiple light-emitting elements is individually controlled.

According to Aspect 15, the phosphor is a quantum dot phosphor.

A display device according to Aspect 16 includes the backlight unit.

A manufacturing method for a backlight unit according to Aspect 17 includes a light source manufacturing process of manufacturing a light source where multiple light-emitting elements are two-dimensionally laid out, a wavelength converting member manufacturing process of forming a wavelength converting member that has a phosphor, and that converts a wavelength of light from the light source, and where a wavelength conversion capability varies in accordance with a distance to a light-emitting element that is closest of the multiple light-emitting elements and a mounting process of mounting the wavelength converting member to the light source.

According to Aspect 18, in the wavelength converting member manufacturing process, a hole is formed in the wavelength converting member.

According to Aspect 19, a film thickness of the wavelength converting member is changed in accordance with a position on the wavelength converting member in the wavelength converting member manufacturing process.

According to Aspect 20, a density of phosphors is changed in accordance with a position on the wavelength converting member in the wavelength converting member manufacturing process, each of the phosphors being the phosphor that the wavelength converting member has.

According to Aspect 21, the wavelength converting member is formed on a substrate in the wavelength converting member manufacturing process.

A manufacturing apparatus of a backlight unit according to Aspect 22 performs manufacturing of a light source where multiple light-emitting elements are two-dimensionally laid out, forming of a wavelength converting member that has a phosphor, and that converts a wavelength of light from the light source, and where a wavelength conversion capability varies in accordance with a distance to a light-emitting element that is closest of the multiple light-emitting elements, and mounting of the wavelength converting member to the light source.

The present invention is not restricted to the above-described embodiments. Various modifications may be made within the scope set forth in the Claims, and embodiments obtained by appropriately combining technical means disclosed in each of different embodiments are also encompassed by the technical scope of the present invention. Further, new technical features can be formed by combining technical means disclosed in each of the embodiments.

REFERENCE SIGNS LIST 2 backlight unit
4 light source
6 wavelength converting member
8 blue-light-emitting element
12 red phosphor
14 green phosphor
18 hole
20 substrate

The invention claimed is:

1. A backlight unit, comprising:
a light source where a plurality of light-emitting elements are two-dimensionally laid out; and
a wavelength converting member that has a phosphor, and that converts a wavelength of light from the light source,
wherein a wavelength conversion capability of the wavelength converting member varies in accordance with a distance to a light-emitting element that is closest of the plurality of light-emitting elements,
wherein the wavelength converting member has a plurality of holes, and a size of the holes varies in accordance with the distance.

2. The backlight unit according to claim 1, wherein the light-emitting element emits blue light.

3. The backlight unit according to claim 1, wherein the wavelength converting member is provided with a red phosphor that emits red light, and a green phosphor that emits green light, as the phosphor.

4. Th backlight unit according to claim 1, wherein the size of the holes increases as the distance becomes longer.

5. The backlight unit according to claim 1, wherein a film thickness of the wavelength converting member varies in accordance with the distance.

6. The backlight unit according to claim 5, wherein the film thickness becomes thinner as the distance becomes longer.

7. The backlight unit according to claim 1, wherein a density of phosphors varies in accordance with the distance, each of the phosphors being the phosphor that the wavelength converting member has.

8. The backlight unit according to claim 7, wherein the density of the phosphors becomes lower as the distance becomes longer.

9. The backlight unit according to claim 1, wherein the wavelength converting member further includes a substrate.

10. The backlight unit according to claim 1, wherein light emission intensity of the plurality of light-emitting elements is individually controlled.

11. The backlight unit according to claim 1, wherein the phosphor is a quantum dot phosphor.

12. A display device, comprising: the backlight unit according to claim 1.

13. A backlight unit, comprising:
a light source where a plurality of light-emitting elements are two-dimensionally laid out; and
a wavelength converting member that has a phosphor, and that converts a wavelength of light from the light source,
wherein a wavelength conversion capability of the wavelength converting member varies in accordance with a distance to a light-emitting element that is closest of the plurality of light-emitting elements,
wherein the wavelength converting member has a plurality of holes, and an interval at which the holes are provided varies in accordance with the distance.

14. The backlight unit according to claim 13, wherein the interval at which the holes are provided becomes shorter as the distance becomes longer.

15. The backlight unit according to claim 13, wherein light emission intensity of the plurality of light-emitting elements is individually controlled.

* * * * *